United States Patent [19]

Vines et al.

[11] Patent Number: 4,734,835

[45] Date of Patent: Mar. 29, 1988

[54] LAMP HOUSING AND VENTILATING SYSTEM THEREFOR

[75] Inventors: James C. Vines, San Jose; Bruce J. Ruff, Los Gatos, both of Calif.

[73] Assignee: General Signal Corporation, Stamford, Conn.

[21] Appl. No.: 912,910

[22] Filed: Sep. 26, 1986

[51] Int. Cl.[4] .............................................. F21V 29/00

[52] U.S. Cl. .................................... 362/264; 362/268; 362/373; 362/376; 362/294

[58] Field of Search ............... 362/294, 345, 373, 374, 362/368, 226, 263, 264, 267, 268, 376; 355/30

[56] References Cited

U.S. PATENT DOCUMENTS

| | | | |
|---|---|---|---|
| 3,642,361 | 3/1972 | Streu | 362/268 |
| 4,321,659 | 3/1982 | Wheeler | 362/373 |
| 4,419,716 | 12/1983 | Koo | 362/294 |
| 4,587,599 | 5/1986 | St. Hilaire | 362/267 |
| 4,630,182 | 12/1986 | Moroi et al. | 362/294 |

*Primary Examiner*—Samuel Scott
*Assistant Examiner*—Noah Kamen
*Attorney, Agent, or Firm*—John F. Ohlandt

[57] ABSTRACT

A lamp housing and an integrated ventilating and cooling system for such housing directed to (1) providing a stable environment for the optimum operation of a mercury arc vapor lamp, (2) providing minimum heat transfer to precision instrumentation adjacent to the lamp housing and (3) overcoming problems resulting from possible failure of a mercury arc vapor lamp contained therein, particularly in the case of explosion. The housing has a double wall construction and contains an inner, sealed lamp chamber such that if the lamp explodes the poisonous mercury vapors, and pieces of the lamp that could damage an associated precision stepper mechanism, are contained inside the chamber; even if the inner chamber walls are breached the mercury vapors are carried away by a suitable vacuum arrangement; moreover, reduction in explosive and other failures is accomplished by preventing uneven heating and cooling of the lamp, the double wall housing including for the purpose a plurality of integrated, elongated, radial cooling fins for dissipating the heat generated by the lamp; additionally, the housing or lamp chamber assembly is very easily removed, being provided with a bayonet latch mechanism such that the entire lamp housing or assembly can be lifted out of place and a substitute quickly inserted.

6 Claims, 4 Drawing Figures

94 42 42B 44 56 58 60 52 38 90 96 50 50 34 62 30 48 14 42A 48 12 10 32 36 72 70 70 24 20 40 18 22 16 26

10
12
14
16
18
20
22
24
26
30
32
34
36
38
40
42
42A
42B
44
48
50
52
56
58
60
62
70
72
90
94
96

LAMP HOUSING AND VENTILATING SYSTEM THEREFOR

BACKGROUND OF INVENTION

1. Field of Invention

This invention relates to an illumination system for microlithographically forming patterns on semiconductor wafers. More particularly, it pertains to a lamp housing or shield and to a cooling and ventilating system associated therewith, the lamp serving as the source in the illumination system.

2. Background Information

The type of apparatus for microlithographically forming patterns on semiconductor wafers in which the present invention serves its particular function can be appreciated by reference to U.S. Pat. No. 4,425,037. That patent, which is assigned to the assignee of its present invention, discloses an improved system including a stepper for projection of pattern images onto a predetermined focal plane. Such apparatus includes as a source of illumination a mercury vapor arc lamp.

A fundamental problem that exists in the described context is that one must provide an optimum operating environment for the mercury vapor lamp in an enclosure or housing which shields the area around the stepper from hazardous ultra violet radiation, which is dangerous to people and can damage photosensitive materials used near the stepper.

Moreover, a heat source can destabilize the metrology of the stepper so heat transfer to the rest of the stepper must be minimized.

Another problem that occurs when mercury vapor lamps are utilized is that the mercury, being poisonous, can produce additional hazardous conditions for personnel in the event that a lamp containing it should explode.

Accordingly, it is a fundamental object of the present invention to overcome this problem of extreme danger always present with the operation of a mercury arc vapor lamp by forming an inner sealed chamber for the lamp or illuminator within a double wall housing, while not compromising the performance of the illuminator.

It is believed that uneven or non-uniform heating and cooling over a typical period of operation of a mercury arc vapor lamp in the context already described may be the cause of the previously noted explosive, as well as other, failures.

Accordingly, it is a further object of the present invention to solve this underlying or causal problem by providing an efficient, integral cooling arrangement for the lamp to enable continuous dissipation of the heat generated by the lamp, thereby to avoid the undesirable non-uniform heating and cooling effects.

A very demanding requirement in the operation of a photolithographic pattern forming apparatus is that the apparatus must be continuously operative in order to produce the finished wafers on an uninterrupted, production line, basis.

Accordingly, it is yet another object of the invention to avoid an extended cooling down period for a failed mercury arc vapor lamp before trying to remove such lamp from its housing or assembly. Accordingly, the length of time that the stepper pattern forming apparatus is not available for production is minimized.

SUMMARY OF THE INVENTION

In accordance with the primary feature of the present invention, whose fundamental object is to provide the optimum operating environment for a hazardous lamp, to insure the control and containment of vapor from a potentially explodable mercury arc vapor lamp or the like and to reduce transfer of heat generated in the operation of the lamp to the remainder of the pattern forming apparatus, a system is provided comprising a housing for the mercury arc vapor lamp, the housing including first and second concentric cylindrical walls, a sealed first or inner chamber in which the mercury vapor lamp is contained being defined by the first wall. An outer or second chamber is provided so as to enable, in the event of an explosion, and under circumstances such that the inner chamber is breached, that the poisonous mercury vapor can be readily ventilated, a vacuum means being connected to an outlet opening in the second chamber, and an inlet opening being provided in such chamber; cooling air is brought in through said inlet opening for ventilation purposes and for enabling continuous cooling of the mercury lamp so as to prevent the causal problem due to the uneven heating and cooling phenomenon already noted.

A specific feature of the invention in connection with the cooling of the mercury vapor lamp resides in the provision of cooling means comprising elongated, radially extending, fins surrounding the lamp chamber and disposed within the annular portion of the outer chamber, so as to provide substantial surface for efficiently dissipating the heat generated by the lamp and allowing the heat to be removed from the stepper.

A further principal feature of the invention resides in the arrangement for insuring that the photolithographic pattern-forming apparatus may be continuously operative. This is accomplished by providing an integral lamp housing and a means for latching this integral housing to the frame of the apparatus so that the entire housing may be removed when there is lamp failure. Consequently, there is no need to wait for an extended period until the failed lamp has cooled down sufficiently before removal of the lamp can be accomplished.

Other and further objects, advantages and features of the present invention will be understood by reference to the following specification in conjunction with the annexed drawings, wherein like parts have been given like numbers.

PREFERRED EMBODIMENT OF THE INVENTION

Figure 1:
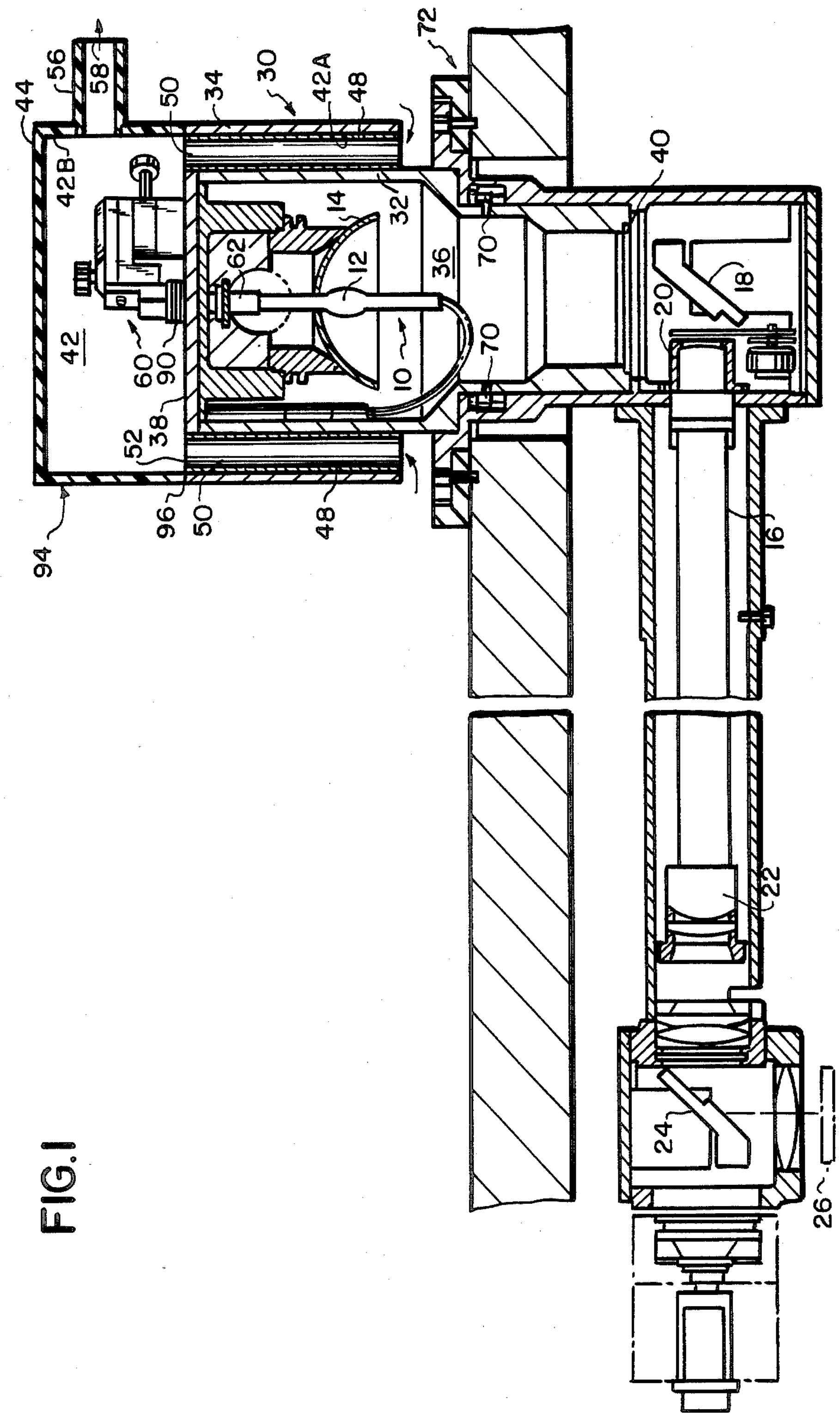
FIG. 1 is an elevation sectional view of the entire optical illumination system in which the lamp housing and system of the present invention is incorporated.
Figure 2:
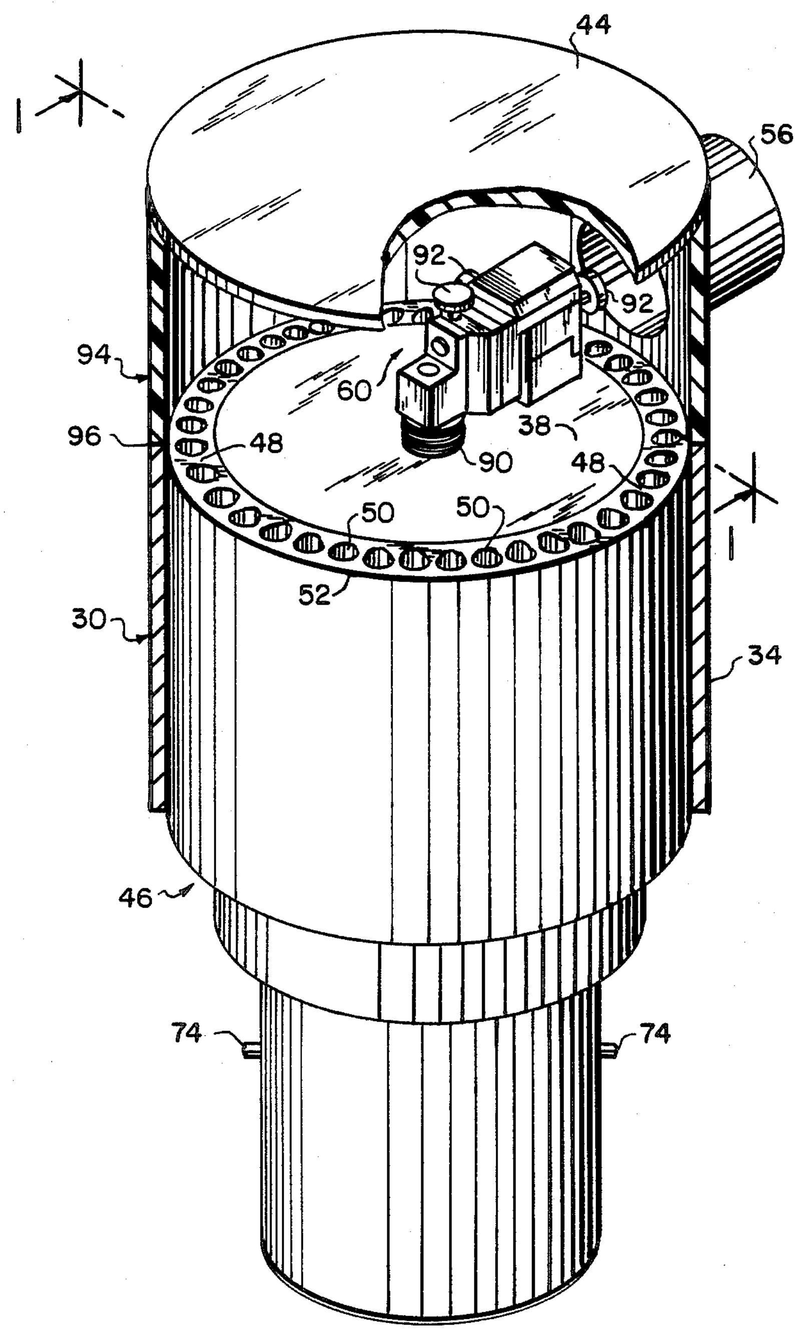
FIG. 2 is a cutaway, perspective view of the lamp housing and system for cooling and ventilating the lamp.

Referring now to the figures of the drawing and in particular for the moment to FIG. 1, there will be seen in this figure a depiction of the optical illumination system in which the device or system of the present invention is incorporated.

Since the illumination system 10 is merely the context in which the present lamp housing is operative, that system will be described briefly in setting forth the preferred embodiment. A detailed description of such illumination system may be found by reference to the previously cited U.S. Pat. No. 4,425,037. The system essentially comprises a light source or lamp 12, such as a mercury arc vapor lamp having a rating of 200 watts. This mercury lamp is pulsed at 500 watts during wafer exposure and held at a standby power of 150 watts during alignment and other operations. Thus, the average power consumption during a typical wafer stepping operation is approximately 200 watts.

An ellipsoidel reflector 14 focuses light from the lamp onto one end of a light pipe 16, a dichroic mirror 18 reflecting only a selected wavelength band of the light, as is understood. A lens system comprising hemispheric lenses 20 and 22 which are cemented to opposite ends of a light pipe 16, and additional suitable lenses, including a lens and mirror arrangement 24, provide ultimately for illumination of a reticle 26, as is also understood.

It will be seen by reference to the upper part of FIG. 1 that a double wall lamp housing 30 is provided in accordance with the present invention. For reasons to be explained, this housing and its attendant components assures that the vapor from the mercury vapor lamp 12 will be contained in all events, particularly in the case of an explosion of such lamp.

The housing 30 can be fabricated as a metal casting of steel or aluminum or the like, and includes a first cylindrical wall 32 at the interior of the housing and another or second cylindrical wall 34 forming the exterior of the housing. A first or inner chamber 36 in which the lamp 12 is contained is defined by the inner wall 32, being further defined by a plate or member 38 forming a top wall. A transparent member or window 40 serves to seal the inner chamber 36 at the bottom end, the member 40 fitting over an opening at the bottom of chamber 36.

A second chamber 42 is also formed within the housing 30. This chamber has an annular portion 42A defined between the inner and outer cylindrical walls 32 and 34. The remainder of the second chamber, that is portion 42B seen above 42A, is defined by the outer wall 34 and top 44 in the form of an integral cover member 94.

A cooling means 46 is disposed in the annular portion 42A of the second chamber 42, such cooling means being integrally formed as part of the casting for the housing 30. The cooling means includes a series of spaced fins 48 defined by inlet passages 50 formed at spaced locations in annular member 52, thereby to permit cooling air as indicated by the arrows to be drawn in at the bottom of annular portion 42A, such air flowing through the passages 50 and into the outer chamber 42 and thence through the outlet opening 56 to a suitable vacuum means designated by the arrow 58, such means per se being one which is conventional and well understood.

It will be appreciated that a conventional support means 60 functions to support the lamp 12 which is held in a typical socket 62, and further that the reflector 14 can be suitably attached at the interior of wall 32 such as by use of an appropriate attachment means.

As will be appreciated, the manner of fulfillment of most of the principal objects of the invention have now been completely described. In particular, by reason of the substantial casting of the housing 30, the inner walls defining the sealed chamber 36 will prevent under most circumstances escape of mercury vapor. However, even in the event that the inner chamber 36 is breached in some way and the mercury vapor escapes from the inner chamber, further backup is provided. That is to say, the escaping mercury vapor will be swept by the ventilating means already described out of the second chamber 42, in particular because of the presence of the vacuum means 58. Moreover, because of the efficient integral cooling arrangement, including the fins 54, dissipation of the heat that is transferred to the inner walls is continuously effected.

A further feature of the invention remains to be described; namely, that feature which insures virtually continuous operation of the pattern forming apparatus because there is no longer any need to shut down for an extended cooling period when the mercury vapor lamp fails. The reason for this is that a latching arrangement 70 is provided to latch the entire lamp assembly or housing 30 to the chassis or frame 72 of the pattern forming apparatus. This arrangement permits removal and precisely alinged replacement of the lamp housing in a minimum time interval, thus totally avoiding the usual necessary shut down period for the system during which the lamp is allowed to cool down before being replaced.

Figure 3A:
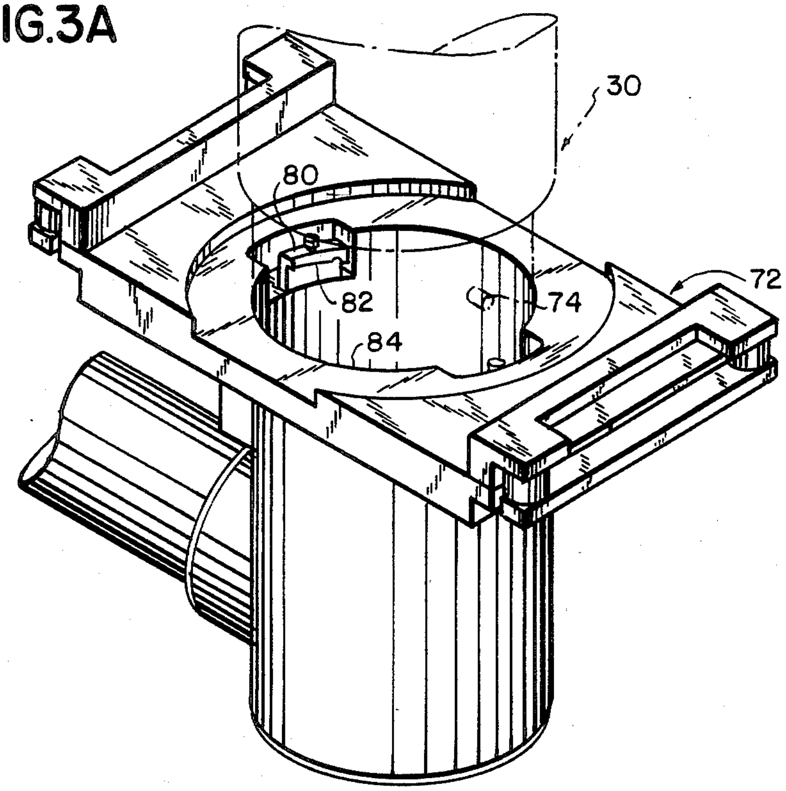
FIG. 3A and 3B illustrate the bayonet latch mechanism for the lamp housing.
Figure 3B:
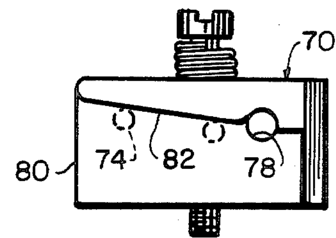

Referring now to FIG. 3 of the drawing, the latching means 70 includes a pair of latching pins 74 spaced diametrically oppositely on the periphery of the lamp housing 30. A corresponding pair of receptacles 78 for engaging the pins are provided on the frame 72, that is the frame of the illuminator housing of the pattern forming apparatus. Specifically, a pair of spring biased latch blocks 80 containing the receptacle are mounted on the frame so as to correspond to the locations of the latch pins 74 on the lamp housing. A ramp 82 is provided on each of the latch blocks such that the pins 74 will be guided along their respective ramps as the lamp housing is suitably rotated; that is, rotated clockwise looking down on the housing. Such clockwise movement is effected once the lamp housing has been suitably placed down into the recess or opening 84 formed in the frame 72 for receiving such lamp housing.

Accordingly, the latch pins 74 will move down along the ramp against the spring bias and into the receptacles 78 upon reaching the end of their travel. The lamp housing 30 will now remain in its latched position. However, if it is desired to quickly detach the lamp housing in the event of an emergency condition, all that the user has to do is simply turn the housing forcefully counterclockwise to free the latch pins from the receptacles, thereby making removal of the housing a further matter of simply lifting the housing from its recess 84. A substitute lamp housing is then put in place such that the stepper operation can immediately continue.

An ancilary feature of the present invention relates to a need that exists for precisely centering and focusing of the lamp 12 with respect to the ellipsoidal reflector 14. Since the lamp operates in a sealed environment within the chamber 36, a bellows pressure seal connection 90 is utilized to effect the lamp adjustment, the bellows connection forming part of the support and control apparatus 60. Three adjusting screws 92 provide for all possible degrees of movement of the bellows connection, and consequently of the lamp 12. The plenum chamber portion 42B of outer chamber 42 is defined by a plastic member 94 which is friction fitted in a conventional way to the lower or annular portion 42A of the outer chamber, being easily separable therefrom along the parting line 96. In this way, any required adjustment of the lamp can be very readily accomplished while the lamp chamber remains sealed.

While there has been shown and described what is considered at present to be the preferred embodiment of the present invention, it will be appreciated by those skilled in the art that modifications of such embodiment may be made. It is therefore desired that the invention not be limited to this embodiment, and it is intended to coverin the appended claims all such modifications as fall within the true spirit and scope of the invention.

We claim:

1. A system for providing a stable environment for the operation of a mercury vapor arc lamp and for containing the vapor therefrom in the event of the explosion of said lamp comprising:

a housing for the mercury vapor arc lamp, said housing including first and second concentric cylindrical walls, and first and second top walls, a sealed first or inner chamber, defined by said first cylindrical wall and by said first top wall, said lamp being contained within said inner chamber;

a second or outer chamber having a lower annular portion defined between said first and second cylindrical walls, the remainder or upper portion of said outer chamber being defined by said second cylindrical wall and by said second top wall;

a cooling means, including a series of spaced elongated, radially directed, fins having inlet passages therebetween, disposed in said annular portion of said outer chamber;

ventilating means, including vacuum means connected to the upper portion of said outer chamber, and further including an inlet opening to the inlet passages in the annular portion of said outer chamber for permitting cooling ambient air to enter the annular portion and be drawn off by said vacuum means.

2. A system as defined in claim 1, further including an outlet opening in said second cylindrical wall to which said vacuum means is connected.

3. A system as defined in claim 1, in which said first or inner chamber is further defined by a bottom wall for completely sealing said inner chamber.

4. A system as defined in claim 1, further including a frame having a pair of latch receptacles, and in which said lamp housing includes a pair of corresponding latch pins for engagement in said receptacles, whereby said lamp housing can be quickly removed from said frame.

5. A system as defined in claim 4, in which said lamp housing includes a shoulder for engaging a surface of said frame, the portion of the lamp housing below said shoulder fitting into a recess in said frame.

6. A system as defined in claim 4, in which a pair of blocks defining said receptacles are mounted on said frame, said blocks being formed to include respective ramps leading to said receptacles, whereby upon rotation of said lamp housing said latch pins are guided along said ramp to said receptacles.

* * * * *